(12) United States Patent
Worledge

(10) Patent No.: US 7,685,708 B2
(45) Date of Patent: Mar. 30, 2010

(54) MULTIPOINT NANOPROBE METHOD OF MAKING

(75) Inventor: Daniel Worledge, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 11/930,401

(22) Filed: Oct. 31, 2007

(65) Prior Publication Data
US 2008/0209721 A1 Sep. 4, 2008

Related U.S. Application Data

(62) Division of application No. 11/251,943, filed on Oct. 17, 2005, now Pat. No. 7,337,536, which is a division of application No. 10/667,049, filed on Sep. 22, 2003, now Pat. No. 6,975,124.

(51) Int. Cl.
*H01R 43/16* (2006.01)
(52) U.S. Cl. ............... 29/874; 29/592.1; 29/842; 29/846; 29/884

(58) Field of Classification Search ............ 29/592.1, 29/842, 874, 884, 846
See application file for complete search history.

(56) References Cited

U.S. PATENT DOCUMENTS

| | | | | |
|---|---|---|---|---|
| 5,360,978 A | * | 11/1994 | Gueret | 250/306 |
| 6,014,032 A | * | 1/2000 | Maddix et al. | 324/762 |
| 6,232,143 B1 | * | 5/2001 | Maddix et al. | 438/100 |
| 7,115,863 B1 | * | 10/2006 | Ishibashi et al. | 250/306 |

* cited by examiner

*Primary Examiner*—C. J Arbes
(74) *Attorney, Agent, or Firm*—Tutunjian & Bitetto, P.C.; Vazken Alexanian

(57) ABSTRACT

A nanoprobe includes a substrate having a layer, which forms a projected portion. A plurality of conductive lines is adhered to the projected portion and the lines extend beyond an end of the projected portion by a distance to form contact points, wherein the lines are connected to material of the projected portion to provide stiffness and the contact points provide flexibility during use.

10 Claims, 6 Drawing Sheets

MULTIPOINT NANOPROBE METHOD OF MAKING

RELATED APPLICATION INFORMATION

This application is a Divisional application of U.S. patent application Ser. No. 11/251,943 filed Oct. 17, 2005 U.S. Pat. No. 7,337,536, issued Mar. 4, 2008, which was a Divisional application of U.S. patent application Ser. No. 10/667,049 filed Sep. 22, 2003 U.S. Pat. No. 6,975,124, issued Dec. 13, 2005.

BACKGROUND OF THE INVENTION

1. Field of the Invention

The present invention relates to probes, and more particularly to a multipoint nanoprobe and method for manufacturing thereof.

2. Description of the Related Art

Measuring the resistance of metal films and semiconductor wafers is typically performed using multipoint probes. These probes are employed for making electrical measurements. With increased interest in the local conductivity of films, there is increased demand for smaller probe dimensions. For example, there is a great deal of interest in measuring low resistance area product (RA) tunnel junctions using Current-in-plane Tunneling, in particular, for applications such as read heads for disk drives. To be useful with current technologies, the RA needs to be roughly about 1 Ohm-micron$^2$.

Current in-Plane Tunneling would be ideally suited for research in this highly competitive area; however, the present generation of microscopic four point probes is not well suited to measuring such a low RA stack. Specifically, data is needed at probe spacings of less than 1 micron, whereas the smallest standard microprobe in use today has a probe spacing of about 1.5 microns. There are several difficulties in making such a nanoprobe.

For example, when the individual probes of a multiprobe structure are brought closer together, they necessarily need to be narrower. This decreases the spring constant, which must be maintained at a constant value in order to ensure reproducible contact to a sample being measured. One solution may include making the probes thicker, but this cannot be continued much beyond an aspect ratio of 1:1 in thickness to width before the probes become susceptible to twisting, or etching the probes becomes difficult. Making the probes shorter to increase the spring constant is also not feasible since this decreases the amount of compliance. That is, one needs to be able to overdrive the probes a few tenths of a micron, at least, in order to make sure that all probes are in good contact. Therefore, a minimum length is perhaps roughly 5 microns, though 10 microns would be safer.

Therefore, a need exists for a multipoint probe, which maintains its elastic properties (e.g., spring constant), is relatively easy to manufacture and provides dimensional sizes, which are capable of measuring even the smallest features on a device or wafer.

SUMMARY OF THE INVENTION

A nanoprobe includes a substrate having a layer, which forms a projected portion. A plurality of conductive lines is adhered to the projected portion and the lines extend beyond an end of the projected portion by a distance to form contact points, wherein the lines are connected to material of the projected portion to provide stiffness and the contact points provide flexibility during use.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

In accordance with the present disclosure, a nanoprobe and a method of manufacture are described. The nanoprobe of the present disclosure provides ample compliance and sufficient stiffness to be capable of permitting reproducible contact with a surface to be measured. In addition, these features of the probe are provided with smaller probe dimensions with less risk of twisting or yielding of the probe fingers.

The present disclosure employs a hand or base that encapsulates the probes or fingers, which extend therefrom. The fingers can be made very short to maintain their stiffness, while the base provides compliance. The base may be considered a wide cantilever.

A method for making such a nanoprobe includes depositing a metal layer. Then, the metal is patterned and etched to form the fingers. A second lithography step is used to define the base and expose the fingers.

Figure 1:
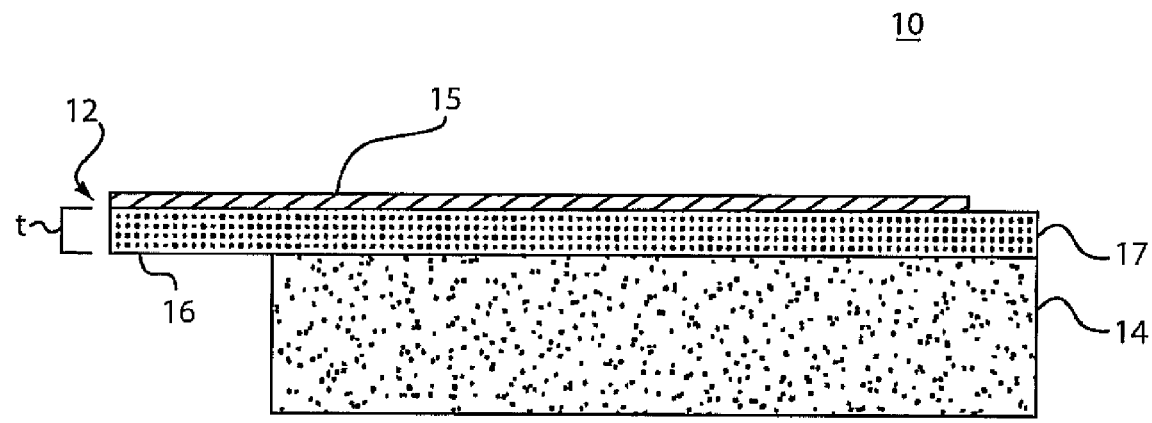
FIG. 1 is a side view of a nanoprobe in accordance with an exemplary embodiment of the present invention.
Figure 2:
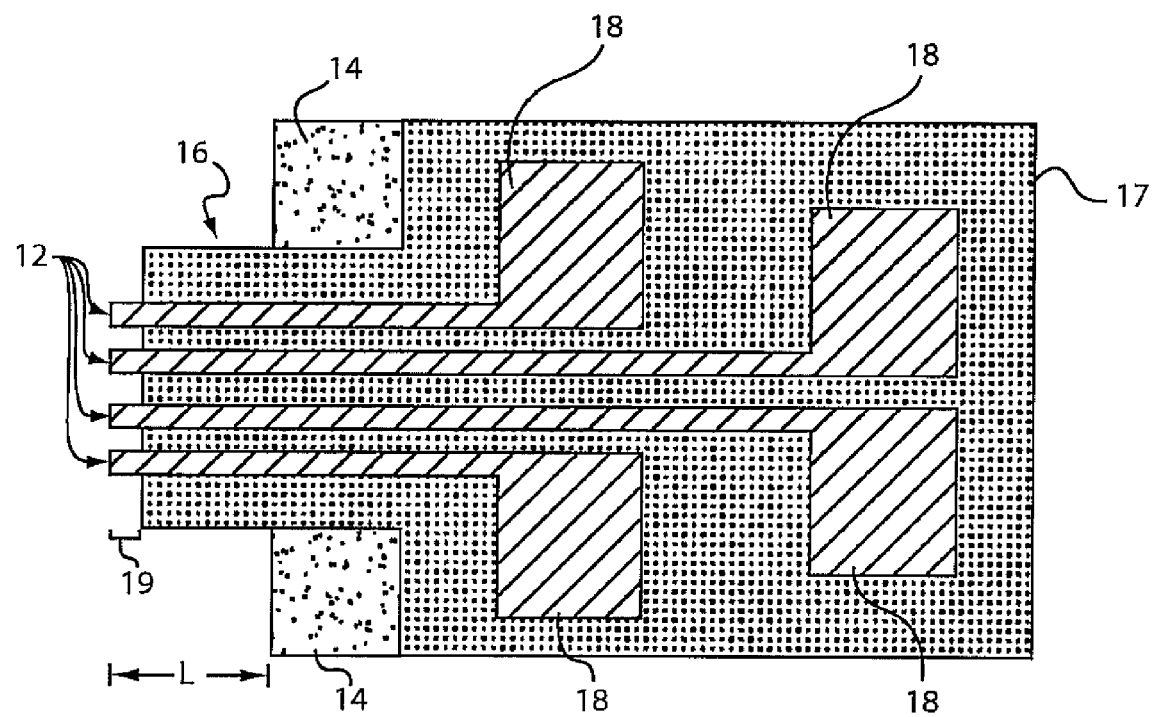
FIG. 2 is a top view of the nanoprobe shown in FIG. 1.

Referring now in detail to the figures in which like numerals represent the same or similar elements and initially to FIGS. 1 and 2, a multipoint nanoprobe 10 is shown in accordance with one embodiment of the present disclosure. Nanoprobe 10 includes four points or fingers 12. Each finger 12 is employed to make contact with a wafer surface, a semiconductor circuit or chip or any other electrical or electronic component to be measured. Although nanoprobe or probe 10 includes four points the present disclosure is also applicable to other numbers of points or fingers. For example, in one embodiment 12 fingers are employed, in another embodiment only two fingers or even one finger are employed.

The conductive surface of fingers 12 is formed from a conductive layer 15 patterned on a surface of a substrate 14. Substrate 14 may include monocrystalline silicon or other material suitable for growing a dielectric layer 17 thereon. If substrate includes silicon, dielectric layer 17 may include, for example, a silicon oxide or a silicon nitride.

After patterning conductive layer 15 to form fingers 12, dielectric layer 17 is selectively removed to expose the tips of fingers 12. This forms a base area or hand 16. The thickness of hand 16 is adjusted to provide the right balance of stiffness and compliance in probe 10. In addition, an extended portion 19 of fingers 12 may be adjusted. The longer the fingers 12 are the more compliance and less stiff the device is. Hand 16 may be modeled as a cantilever beam and calculations may be performed to determine appropriate dimensions to achieve desired results.

In one embodiment, a thickness t of portion 16 is between about 100 nm to about 1000 nm. The corresponding thickness of conductive layer 15 may be between about 1% and about 10% of the thickness t. In a particularly useful embodiment, fingers are 300 nm by 300 nm in cross-section and extend past layer 16 by about 0.5 microns. A length L may be about 10 microns.

Conductive layer 15, which is used as the conducting surface of fingers 12, may include a metal layer of between about 100 angstroms and 1000 angstroms. The metal layer preferably includes a noble metal or a metal that forms a conductive oxide. For example, metal layer 15 may include one or more of Ag, Au, Pt, Ir, Ru, Pd, or alloys thereof. In particularly useful embodiments, a Pt—Ir alloy is employed.

Contact pads 18 may be formed concurrently with the patterning of conductive layer 15 to form fingers 12. In other embodiments, pads 18 may be employed to connect to other circuits or systems, or be employed to add chips, devices or other components on substrate 14, which would provide convenience or functional advantages for employing probe 10. For example, a 12 point probe may employ a multiplexer (not shown) mounted on substrate 14 or layer 17 to permit selective activation of, e.g., four fingers 12 at a time for making measurements.

Point-to-point pitch between fingers 12 may be about 600 nm. Other pitches may also be employed. It is advantageous to provide a probe having a smallest possible pitch, but retaining, elastic properties (e.g., spring constant) and compliance. Of course, the minimum pitch of fingers 12 relies on a smallest width possible for fingers 12, which can still provide the desired properties of probe 10.

In useful embodiments, the fingers 12 may extend beyond the hand 16 by a length of about 0.5 microns. The spring constants may be between about 0.01 and about 100 N/m. Two criteria, which are of note, include reproducible positioning of the probe contacts and compliance. Another consideration includes the fatigue limit, measured in the number of successive engages the probe can withstand.

Figure 3:
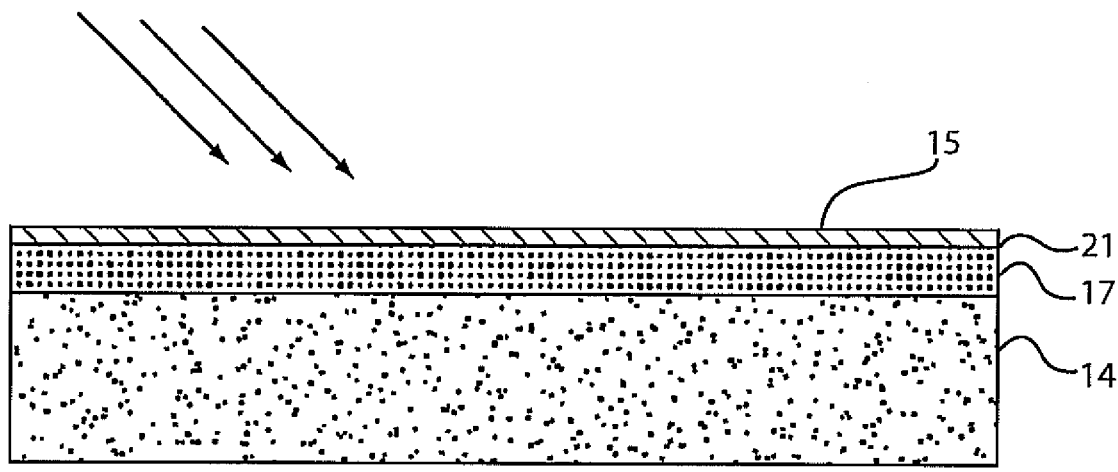
FIG. 3 is side view of a substrate having a dielectric layer, seed layer and a conductive layer formed thereon.

Referring to FIG. 3, a method for fabricating a multipoint nanoprobe will now be described. Beginning with substrate 14, a dielectric layer(s) is/are deposited by any known process, such as for example physical vapor deposition (PVD) chemical vapor deposition (CVD), or thermal growth. If substrate 14 includes crystal silicon, dielectric layer 17, preferably includes silicon nitride or silicon oxide. After deposition of layer 17, an etch step or polish step may be employed to prepare the surface of layer 17.

A seed layer 21 is deposited on the surface of layer 17. Seed layer 21 is deposited to provide good adherence for conductive materials, which will be deposited in subsequent steps. In one embodiment, seed layer 21 includes Ti, Cr or a combination thereof. In particularly useful embodiments, a seed layer 21 of Ti or Cr is deposited at about 100 angstroms thick on the surface of layer 17. Seed layer 21 may be deposited using, for example, a sputtering technique, or other PVD or CVD process.

In a same processing chamber and by similar methods, conductive layer 15 is deposited on seed layer 21 taking advantage of seed layer 21 to form strong adhesion between conductive layer 15 and dielectric layer 17. Conductive layer 15 may include a metal, an alloy or conductive oxides of metals as described above. In one embodiment, layer 15 includes a Pt—Ir alloy deposited on seed layer 21 at a thickness of between 100 angstroms to about 1000 angstroms. Other dimensions are also contemplated. Optionally, layer 15 may itself be used as a seed layer for a later electroless deposition step, as described below. For example, layer 15 may be a TaN layer if it is planned to deposit Ru by electroless plating later.

As described above, layer 17 is deposited having a sufficient thickness to bolster the stiffness of the probe without losing compliance needed to preload the probe against the surface to be measured. Knowing the material properties and the dimensions of layers 17 and 15, a calculation of cantilever spring constants for thin film materials can be determined to meet device specifications. These calculations may include assumptions about the elasticity of the materials and may employ superposition theory to calculate the desired quantities, such as spring constant, maximum deflection, cycle fatigue limit, etc.

The dimensions, e.g., thickness of layers will be determined based on these determinations and any dimension lost to processing steps such as etching, etc. This is also applicable to the widths of fingers 12 which will be formed in the following steps based on lithography techniques.

Figure 4:
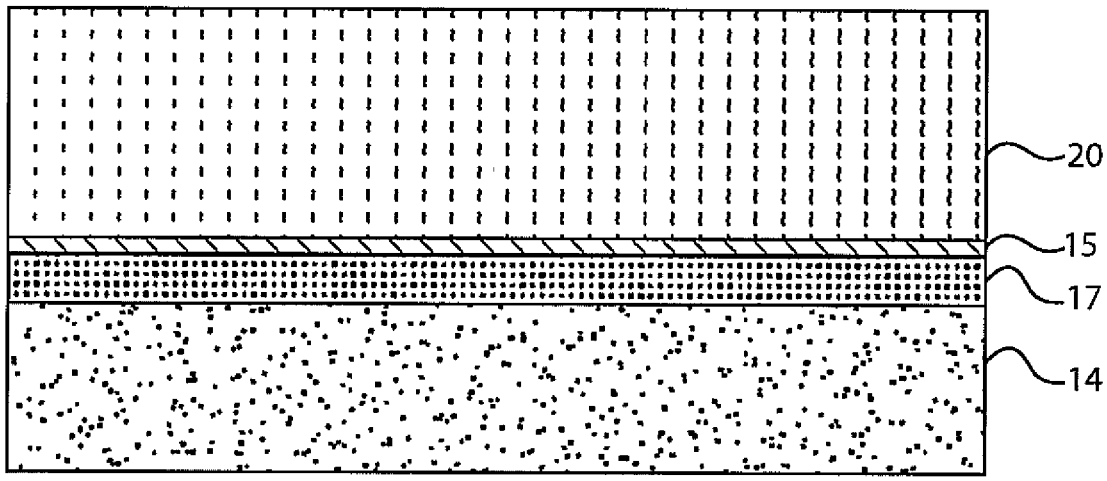
FIG. 4 is a side view showing the substrate of FIG. 3 with a photoresist deposited on the conductive layer for patterning the conductive layer.
Figure 5:
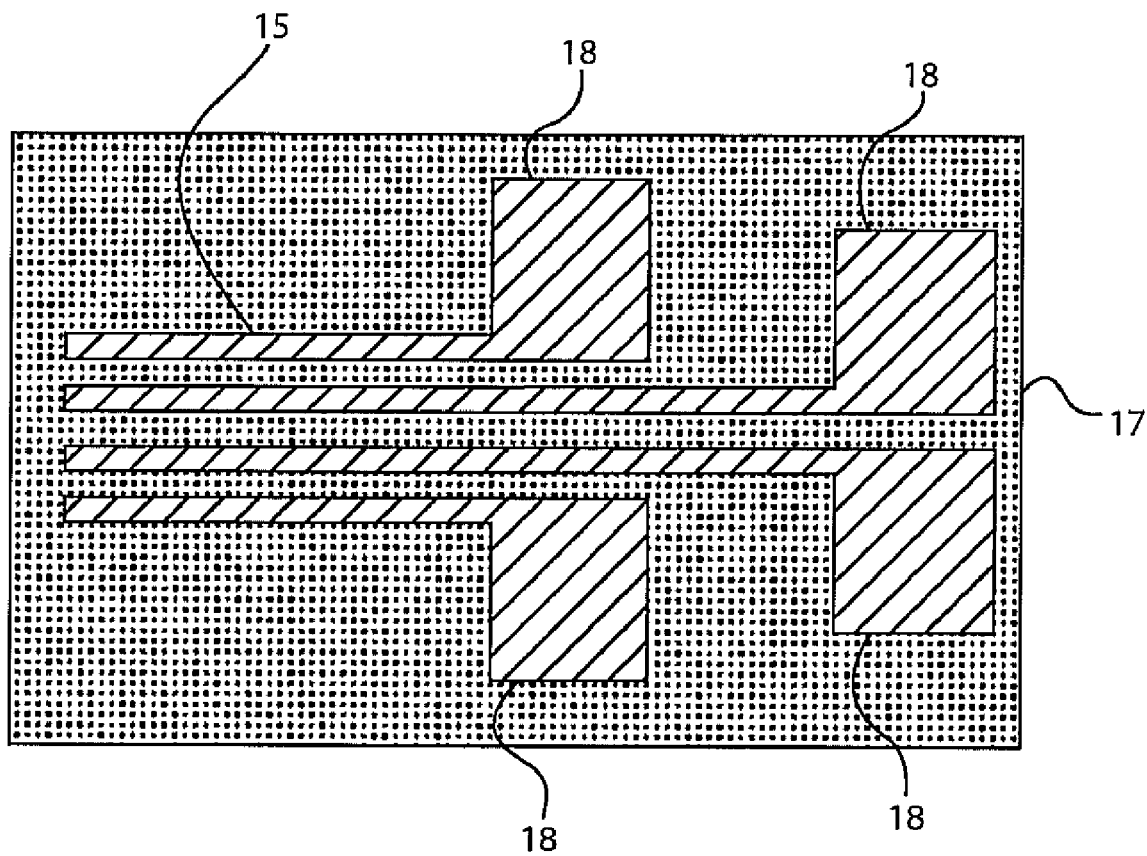
FIG. 5 is a top view of the substrate of FIG. 4 after patterning the conductive layer and removing the photoresist.

Referring to FIG. 4, a resist (photoresist or ebeam resist) 20 is spun onto the surface of layer 15. Resist 20 is then processed in accordance with known lithography techniques to pattern layer 15. Resist 20 is opened up on selected surfaces of layer 15 and used as a mask to protect portions of layer 15 remaining unexposed by the resist. Layer 15 is then etched by, for example, an anisotropic etching process to leave the illustrative pattern shown in FIG. 5. FIG. 5 shows a top view of substrate 14 with layer 17 thereon left exposed where conductive layers 15 and 21 have been etched away.

The illustrative structure shown in FIG. 5 includes pads 18, which may be used to make electrical connections to instrumentation (not shown) or to other devices or components, which may be formed on the probe or mounted thereon. As noted above, FIG. 5 shows a four-point probe; however, the present disclosure is applicable to any number of probes.

Figure 6:
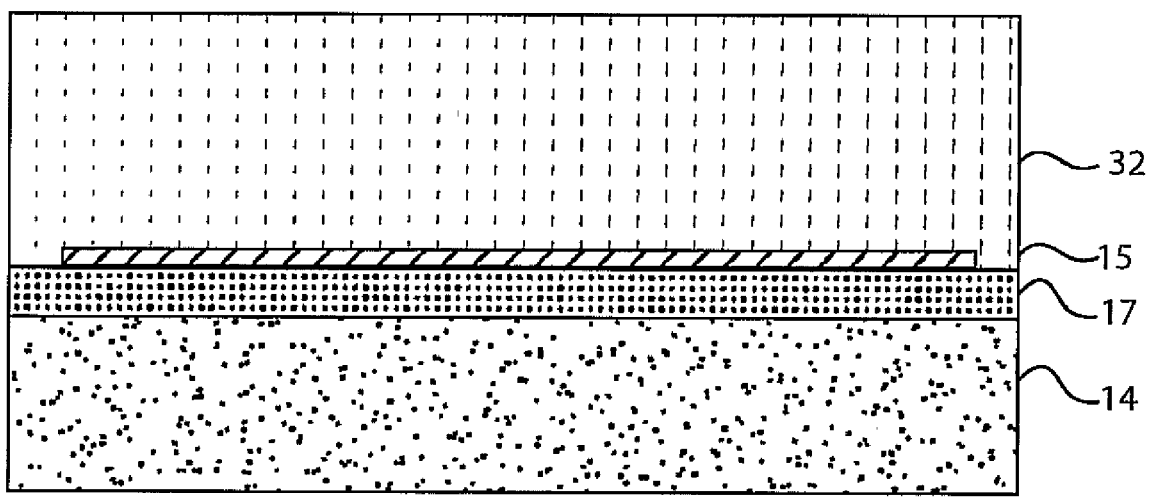
FIG. 6 is a side view showing the substrate of FIG. 5 with a photoresist deposited on top of the dielectric and conductive layers for patterning the dielectric layer.
Figure 7:
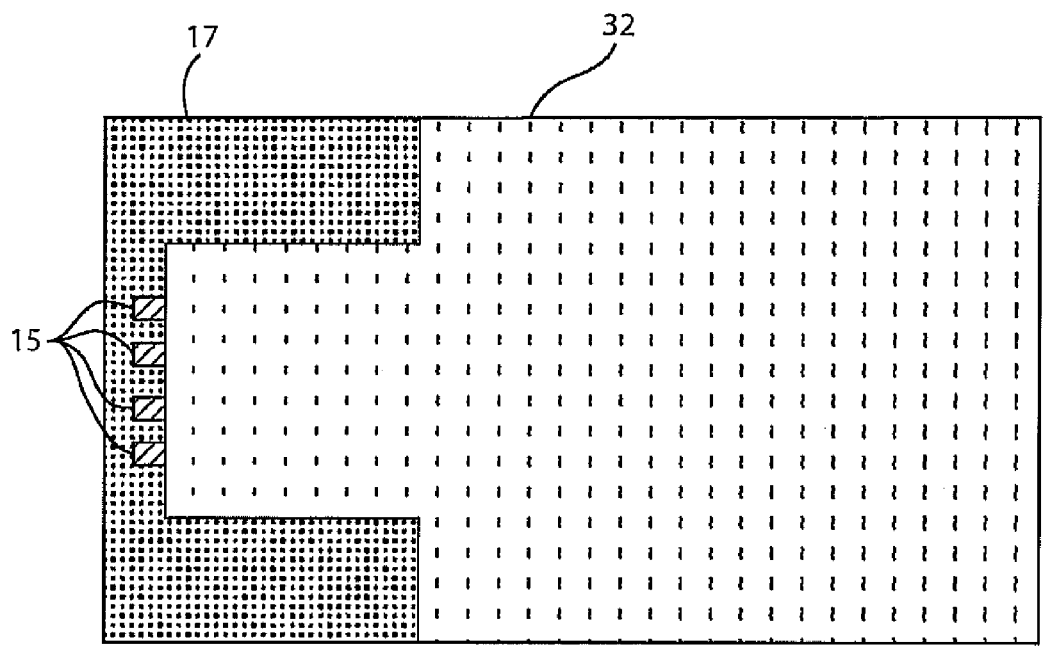
FIG. 7 is a top view of the substrate of FIG. 6 after exposing and developing the photoresist.

Referring to FIGS. 6 and 7, a photoresist (or ebeam resist) 32 is spun onto the surface of layers 15 and 17. The resist 32 is lithographically processed to expose a portion of dielectric layer 17 and conductive layer 15 to form fingers 12 as will be described. This resist step defines the length of the fingers 12 which may be roughly 0.5 microns, for example. The resist 32 masks off a portion of dielectric layer 17. Part of this masked area will form the base area or hand 16. In addition, the conductive layer 15 of the fingers 12 (see FIG. 7) masks off a portion of dielectric layer 17. This masked area will form the fingers 12. Dielectric layer 17 is then etched to remove it.

Figure 8:
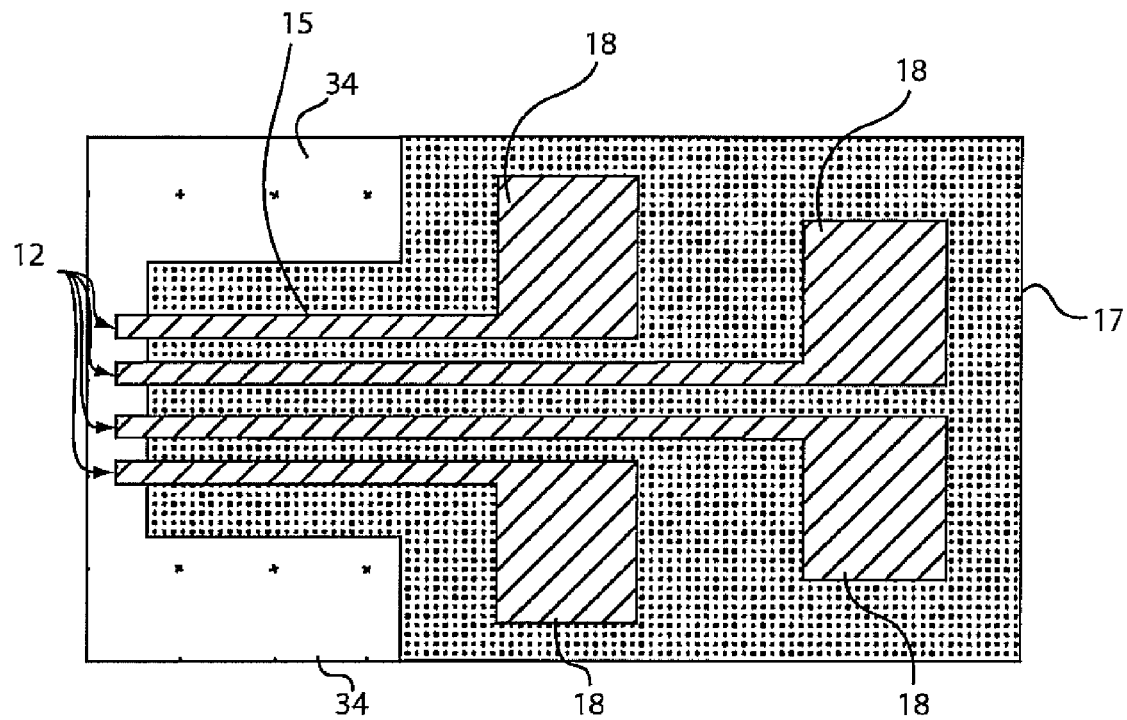
FIG. 8 is a top view of the substrate of FIG. 7 after etching the dielectric layer and removing the photoresist.

Then, the resist 32 is removed. FIG. 8 shows a top view with substrate 14 exposed where dielectric layer 17 has been etched away in regions 34.

At this point an optional step of encapsulating the front side of the substrate may be performed to protect the conductive layer 15 from the following step, which etches the substrate from the backside. A blanket layer of photoresist or some other material such as silicon nitride or silicon oxide can be deposited, completely covering layer 15, the fingers 12, the exposed portion of the substrate 34 and the dielectric layer 17. If layer 17 is composed of silicon oxide, the blanket protection layer could be composed of silicon nitride or vice versa.

Figure 9:
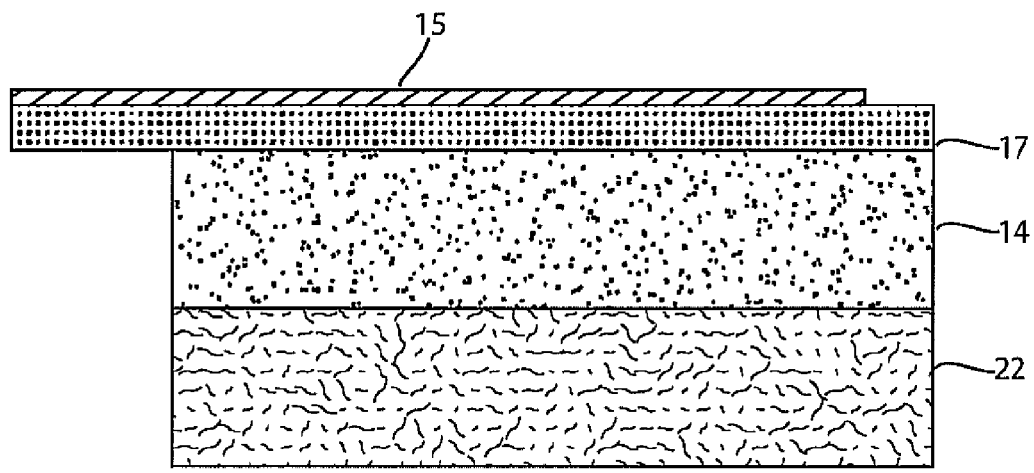
FIG. 9 is a side view of the substrate of FIG. 8 having a processed photoresist formed on the substrate opposite the side having the conductive layer deposited for selectively etching the substrate to expose a portion of the dielectric layer.
Figure 10:
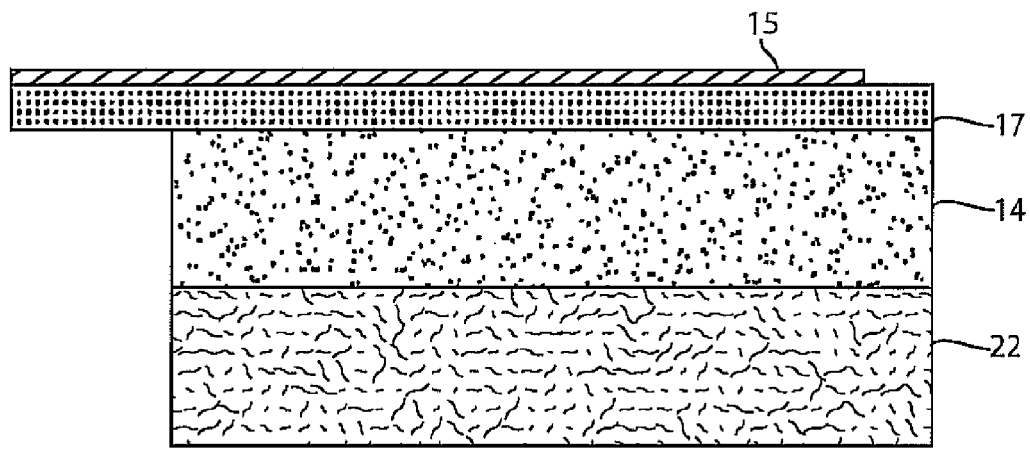
FIG. 10 is a side view of the substrate of FIG. 9 after the dielectric layer has been exposed by etching.
Figure 11:
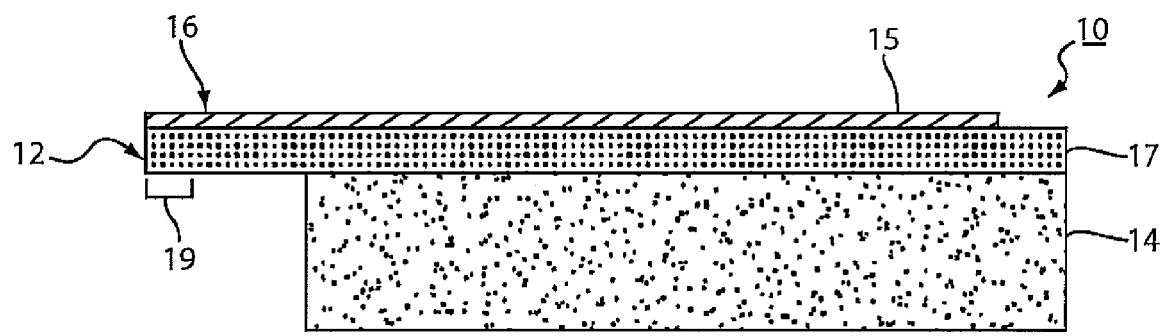
FIG. 11 is a side view of the substrate of FIG. 10 after removing the photoresist.

Referring to FIG. 9, a photoresist 22 is spun onto an opposite side of substrate 14. Photoresist 22 is lithographically processed to expose a portion of substrate 14. This process is employed to release the base or hand 16 and fingers 12 (see FIG. 2) by removing substrate 14 from below this area as shown in FIG. 10. Substrate 14 is selectively etched with respect to dielectric layer 17 such that layer 17 remains after material of substrate 14 has been removed from selected areas. Resist 22 is then removed as shown in FIG. 11.

At this point, if the optional blanket protective layer was deposited, it is selectively etched with respect to layers 15 and 17, so that all of the blanket protective layer is removed and none of layers 15 or 17 are removed.

An optional electroless plating step may be performed to deposit additional metal onto layer 15. This deposited material may include a metal, an alloy or conductive oxides of metals as described above, and may be of the same or different composition as layer 15.

Figure 12:
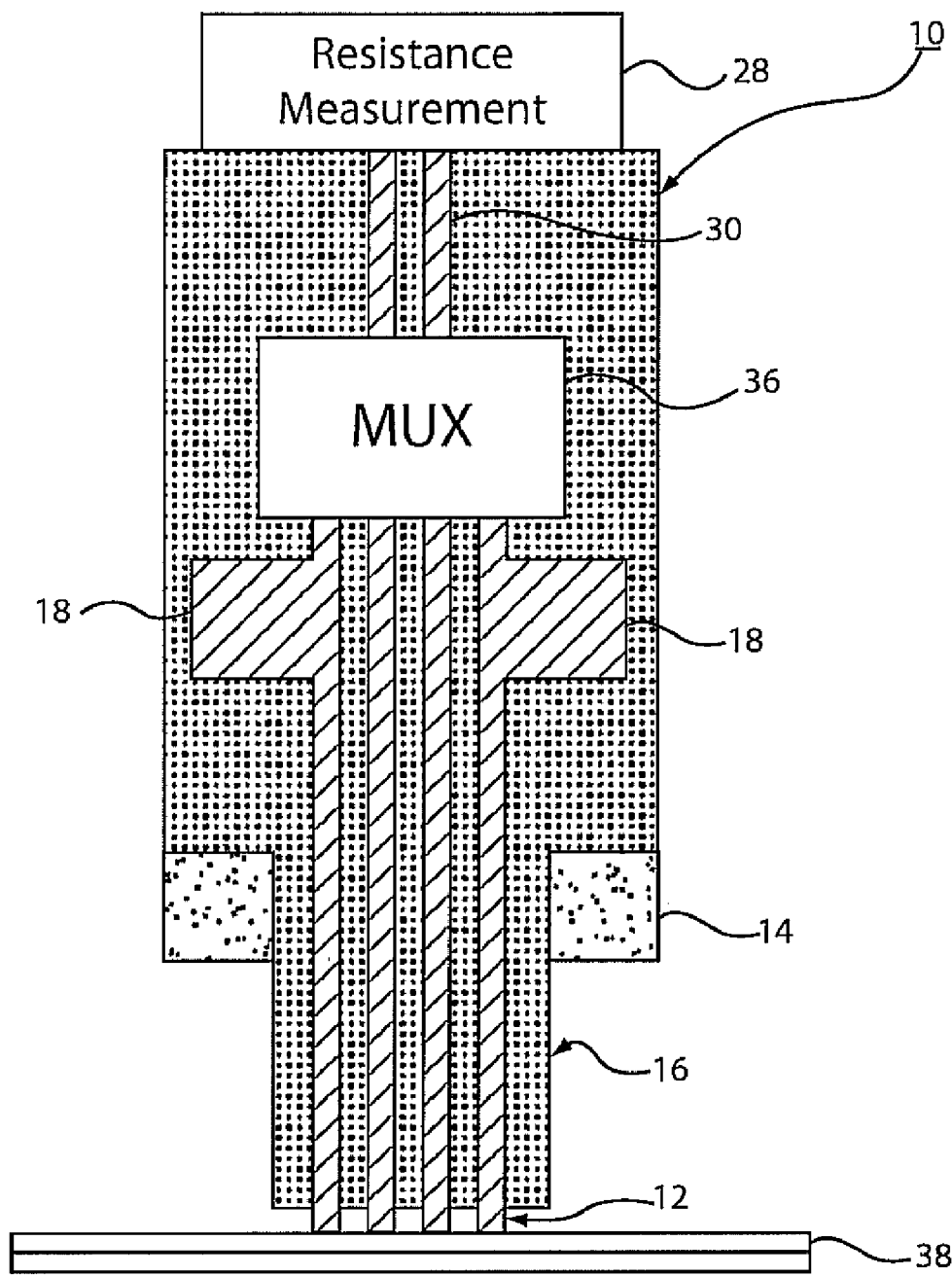
FIG. 12 depicts a nanoprobe during an electrical test of a wafer.

Referring to FIG. 12, nanoprobe 10 may be employed in a plurality of applications. One preferred embodiment employs nanoprobe 10 for taking electrical measurements from a surface, for example, a wafer surface 38.

In one application, nanoprobe 10 may be employed for characterizing tunnel junction film stacks. For such junctions, a magnetic field generator is used to generate a magnetic field, and a multipoint probe 10 having four or more probes, where the smallest spacing between any two of the multiple probes used during a resistance measurement has a spacing of, say 1.5 micron or less, and a resistance measuring module 28 coupled to the multi-point probe and adapted to measure resistance. The magnetic field is generated to place a semiconductor wafer 38 having a tunnel junction film stack into one of a plurality of magnetizations for the tunnel junction film stack. A resistance measurement by the resistance module 28 at these magnetizations at least partially characterizes the tunnel junction film stack. Additionally, various probes and contact pad 18 configurations may be provided.

Advantageously, a multi-point probe 10 is described that permits many different voltage measurements to be taken very quickly. When using the multi-point probe 10, a multiplexer 36 may be used to couple probes to the resistance-measuring module 28. Probe spacings are generally selected to be within a predetermined distance from a length scale, which is related to the RA product of a tunnel junction film stack being measured.

Module 28 and multiplexer 36 or other components, circuits or chips may be mounted or formed on probe 10, or may be coupled to the probe by electrical connections 30.

Having described preferred embodiments of a multipoint nanoprobe and method for fabrication (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for fabricating a nanoprobe, comprising the steps of:
    forming a dielectric layer on a substrate;
    patterning conductive lines on the dielectric layer by employing lithography;
    removing a portion of the dielectric layer to form a projected portion of the dielectric layer and contact fingers in areas with the conductive lines; and
    removing a portion of the substrate to expose the dielectric layer over a distance.

2. The method as recited in claim 1, wherein the step of patterning conductive lines includes depositing a metal layer on the dielectric layer.

3. The method as recited in claim 2, wherein the step of depositing a metal layer includes the step of depositing a seed layer prior to depositing the metal layer.

4. The method as recited in claim 1, wherein the conductive layer includes one or more of Ag, Au, Pt, Ir, Ru, Pd and their alloys.

5. The method as recited in claim 1, wherein the step of removing a portion of the dielectric layer includes forming a hand from the dielectric layer to support the contact fingers.

6. The nanoprobe as recited in claim 1, wherein the step of patterning includes forming the conductive lines to include a thickness of between about 1% and about 10% of a thickness of the dielectric layer.

7. The method as recited in claim 1, wherein the step of patterning includes forming conductive lines each having a thickness and a width which are 300 nm or less.

8. The method as recited in claim 1, wherein the step of patterning includes forming conductive lines including a pitch of less than or equal to one micron.

9. The method as recited in claim 8, wherein the pitch is less than or equal to 600 nm.

10. The method as recited in claim 1, further comprising the step of forming circuitry on the nanoprobe.

* * * * *